(12) United States Patent
Park (10) Patent No.: US 8,437,211 B2
(45) Date of Patent: May 7, 2013

(54) SEMICONDUCTOR SYSTEM AND DEVICE, AND METHOD FOR CONTROLLING REFRESH OPERATION OF STACKED CHIPS

(75) Inventor: Byoung-Kwon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 205 days.

(21) Appl. No.: 12/916,772

(22) Filed: Nov. 1, 2010

(65) Prior Publication Data

US 2012/0008434 A1 Jan. 12, 2012

(30) Foreign Application Priority Data

Jul. 8, 2010 (KR) .................. 10-2010-0065864

(51) Int. Cl.
*G11C 7/00* (2006.01)
*G11C 8/00* (2006.01)
(52) U.S. Cl.
USPC ........... 365/222; 365/191; 365/194; 365/196; 365/230.03
(58) Field of Classification Search .............. 365/191, 365/194, 196, 222, 230.03
See application file for complete search history.

(56) References Cited

U.S. PATENT DOCUMENTS

2009/0268539 A1* 10/2009 Ruckerbauer et al. ........ 365/222
2011/0087835 A1*  4/2011 Sato et al. ..................... 711/106

FOREIGN PATENT DOCUMENTS

JP 2007-140948 6/2007
JP 2007-265548 10/2007

OTHER PUBLICATIONS

Notice of Preliminary Rejection issued from Korean Intellectual Property Office on Nov. 22, 2011.

* cited by examiner

*Primary Examiner* — Ly D Pham
(74) *Attorney, Agent, or Firm* — IP & T Group LLP (57) ABSTRACT

A system for controlling a refresh operation of a plurality of stacked semiconductor chips includes a first semiconductor configured to output a refresh signal for performing a refresh operation, and a semiconductor chip discrimination signal, and a plurality of second semiconductor chips configured to perform a refresh operation at different timings in response to the refresh signal, and the semiconductor chip discrimination signal.

13 Claims, 6 Drawing Sheets

SEMICONDUCTOR SYSTEM AND DEVICE, AND METHOD FOR CONTROLLING REFRESH OPERATION OF STACKED CHIPS

CROSS-REFERENCE TO RELATED APPLICATIONS

The present application claims priority of Korean Patent Application No. 10-2010-0065864, filed on Jul. 8, 2010, which is incorporated herein by reference in its entirety.

BACKGROUND OF THE INVENTION

Exemplary embodiments of the present invention relate to a semiconductor design technology, and more particularly, to a system, a semiconductor device, and a method for controlling a refresh operation of a plurality of stacked semiconductor chips.

In general, a semiconductor memory cell performs a refresh operation by periodically activating a word line in order to substantially maintain data.

However, when a plurality of banks of a semiconductor memory device activate corresponding word lines, a peak current may increase.

In order to reduce the peak current, banks may be grouped (e.g., into groups of two, four, etc.) and then operated on a group by group basis.

For example, if a semiconductor memory cell includes eight banks, the banks BANK<0:7> may simultaneously perform the refresh operation, the banks BANK<0:7> may be divided into two groups such as banks BANK<0:3> and banks BANK<4:7> to perform the refresh operation, or the banks BANK<0:7> may be divided into banks BANK<0:1>, banks BANK<2:3>, banks BANK<4:5> and banks BANK<6:7> to perform the refresh operation.

Meanwhile, a demand for a high density semiconductor device is increasing, resulting in the improvement of the integration degree thereof through a scaling-down method that reduces a line width. However, recently, such a method of scaling-down has reached a technical limit. In order to address the technical limit, various types of stacked package technologies are being developed.

Particularly, a stacked semiconductor package using conductive lines which are formed through a semiconductor chip (also referred to as a through silicon via (TSV)) has bee proposed. According to a known fabrication method of the stacked semiconductor package, a via hole is formed through a semiconductor chip, a conductive material is filled in the via hole to form an electrode referred to as a through silicon via, and an upper semiconductor chip is electrically coupled to a lower semiconductor chip through the through silicon via.

Figure 1:
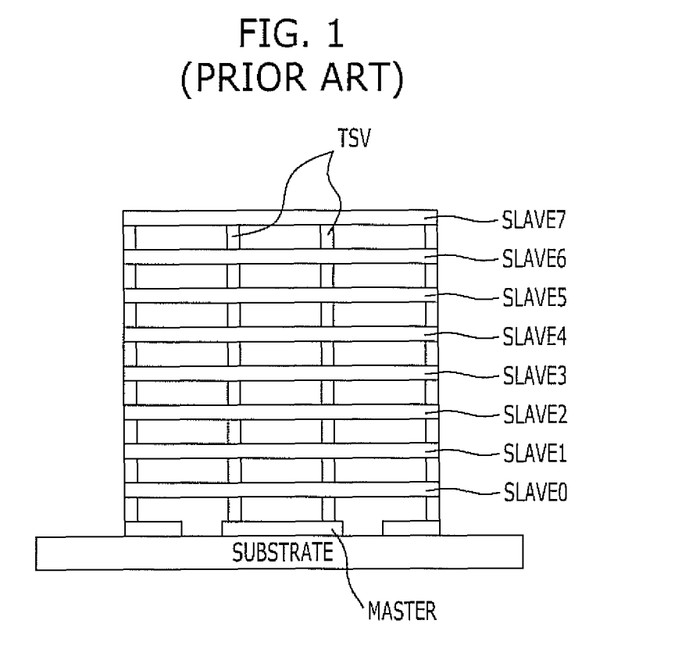
FIG. 1 is a diagram illustrating a known semiconductor chip stacked using a through silicon via (TSV).

FIG. 1 is a diagram illustrating a known stacked semiconductor chip package using a through silicon via (TSV).

Referring to FIG. 1, in such a semiconductor chip package, since the number of banks in the stacked semiconductor chip package increases in proportion to the number of slave chips, a peak current may increase and a charge pump area for supplying a supply voltage may also increase.

SUMMARY OF THE INVENTION

Exemplary embodiments of the present invention are directed to a system, a semiconductor device, and a method for controlling stacked chips to perform a refresh operation in each slave chip at different timings.

In accordance with an exemplary embodiment of the present invention, a semiconductor system for controlling a refresh operation of a plurality of stacked semiconductor chips includes a first semiconductor configured to output a refresh signal for performing a refresh operation, and a semiconductor chip discrimination signal, and a plurality of second semiconductor chips configured to perform a refresh operation at different timings in response to the refresh signal, and the semiconductor chip discrimination signal.

In accordance with another exemplary embodiment of the present invention, a semiconductor device for controlling a refresh operation of a plurality of stacked chips includes a master chip, and a plurality of slave chips configured to perform a refresh operation at different timings in response to a first delayed input signal which serves as a bank active signal in the refresh operation.

In accordance with yet another exemplary embodiment of the present invention, a semiconductor device for controlling a refresh operation includes a delay control circuit configured to delay a first input signal which serves as a bank active signal in a refresh operation, in response to a semiconductor chip discrimination signal, and output the delayed signal as a first output signal of a second semiconductor, and an end signal generation circuit configured to generate a bank active end signal representing end of bank activation, in response to a slave end signal representing a last second semiconductor, and the first output signal of the last second semiconductor.

In accordance with still another exemplary embodiment of the present invention, a method for controlling a refresh operation of a plurality of stacked chips includes providing bank active signals for activating banks to a plurality of slave chips, generating a first output signal delayed by a certain delay amount by using the provided bank active signal, and performing a refresh operation of a corresponding slave chip in response to the delayed first output signal, inputting the delayed first output signal as a first input signal of a next slave chip, and repeating the generating of the first output signal, the performing of the refresh operation, and the inputting of the delayed output signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In an exemplary embodiment of the present invention, it is assumed that eight slave chips are stacked and banks arranged in each slave chip are classified into two-grouped banks (a first group: BANK<0:3> and a second group: BANK<4:7>). Since the configuration and operation of the banks of the second group BANK<4:7> are the same as those of the banks of the first group BANK<0:3>, only the configuration and operation of the banks of the first group BANK<0:3> will be described.

Figure 2:
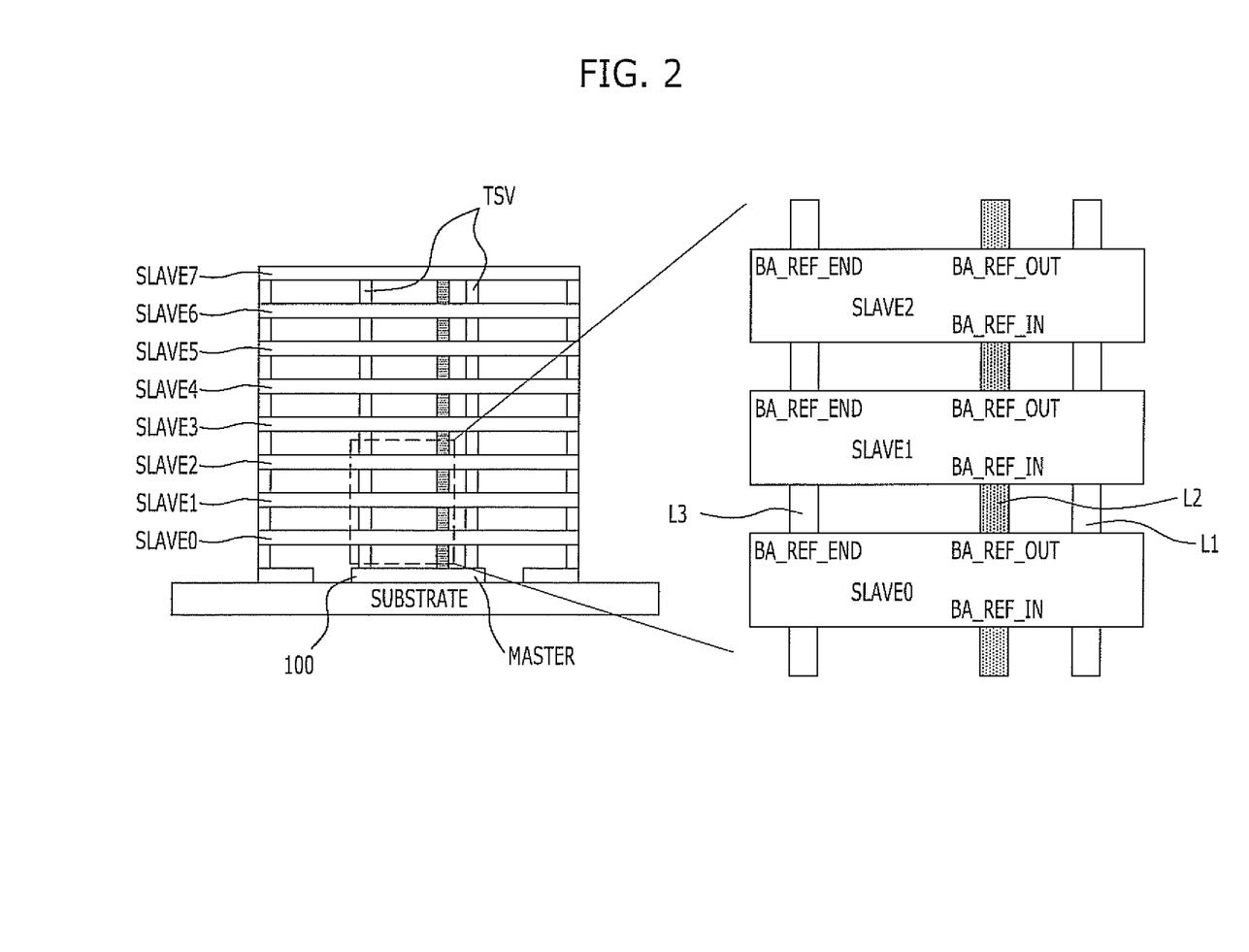
FIG. 2 is a diagram illustrating a semiconductor device for controlling a refresh operation of a plurality of stacked chips in accordance with an exemplary embodiment of the present invention.

FIG. 2 is a diagram illustrating a semiconductor device for controlling a refresh operation of a plurality of stacked chips in accordance with an exemplary embodiment of the present invention.

Referring to FIG. 2, the semiconductor device for controlling the refresh operation of the plurality of stacked chips in accordance with the exemplary embodiment of the present invention includes a master chip 100 and a plurality of slave chips SLAVE0 to SLAVE7.

The master chip 100 is configured to provide the plurality of slave chips SLAVE0 to SLAVE7 with a refresh signal REF for performing a refresh operation in the plurality of slave chips SLAVE0 to SLAVE7, bank active signals BA<0:3> for activating each bank, and slave chip discrimination signals SLICE<0:2> through a first through silicon via L1.

During a test mode, test refresh signals TAREF<0:2>, which serve as refresh signals in the test mode, may also be provided to the plurality of slave chips SLAVE0 to SLAVE7 through the first through silicon via L1.

The plurality of slave chips SLAVE0 to SLAVE7 are configured to perform a refresh operation at different timings in response to the refresh signal REF, a first input signal BA_REF_IN, and the second semiconductor discrimination signals SLICE<0:2>. Here, the plurality of slave chips SLAVE0 to SLAVE7 delay the first input signal BA_REF_IN (this may be a bank active signal for refresh operation) by a certain delay amount, thereby delaying refresh operations in each slave chip.

Furthermore, a slave chip outputs the first delayed input signal BA_REF_IN as a first output signal BA_REF_OUT of the slave chip through a second through silicon via L2, and a next (upper) slave chip receives the first output signal BA_REF_OUT of the slave chip as a first input signal BA_REF_IN of the next (upper) slave chip through the second through silicon via L2.

The plurality of slave chips SLAVE0 to SLAVE7 are configured to delay the first input signal BA_REF_IN by the certain delay amount, thereby allowing the refresh operations to be performed at different timings.

The plurality of slave chips SLAVE0 to SLAVE7 may perform the above operations sequentially, so that the refresh operation in each slave chip is performed sequentially.

Meanwhile, a last (uppermost) slave chip SLAVE7 is configured to provide the master chip 100 with a bank end signal BA_REF_END, representing a completion of the refresh operation of the banks, through a third through silicon via L3, thereby allowing the master chip 100 to end the refresh operation.

Figure 3:
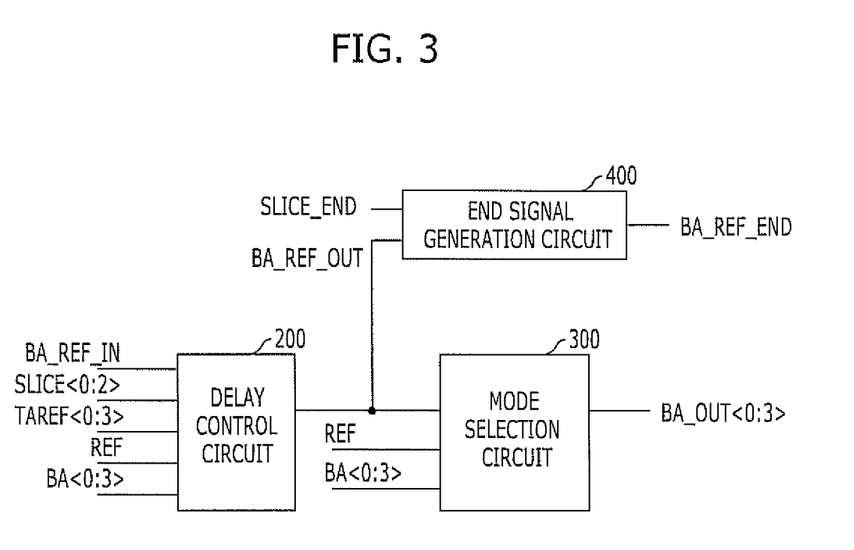
FIG. 3 is a block diagram illustrating the detailed configuration of a portion of a slave chip for controlling a refresh operation in accordance with an exemplary embodiment of the present invention.

FIG. 3 is a block diagram illustrating the detailed configuration of a portion of a slave chip for controlling the refresh operation in accordance with an exemplary embodiment of the present invention.

Referring to FIG. 3, each slave chip includes a delay control circuit 200, a mode selection circuit 300, and an end signal generation circuit 400.

The delay control circuit 200 is configured to delay a first input signal BA_REF_IN. Further, the delay control circuit 200 may receive a refresh signal REF, bank active signals BA<0:3>, the first input signal BA_REF_IN, and slave chip discrimination signals SLICE<0:2> from a master chip or another slave chip.

During a test mode, test refresh signals TAREF<0:2> are provided to the delay control circuit 200.

The delay control circuit 200 may perform a logical operation using the refresh signal REF, the first input signal BA_REF_IN, and the slave chip discrimination signals SLICE<0:2> to delay first input signal BA_REF_IN by a certain delay amount, and output a first output signal BA_REF_OUT of the slave chip.

Figure 4:
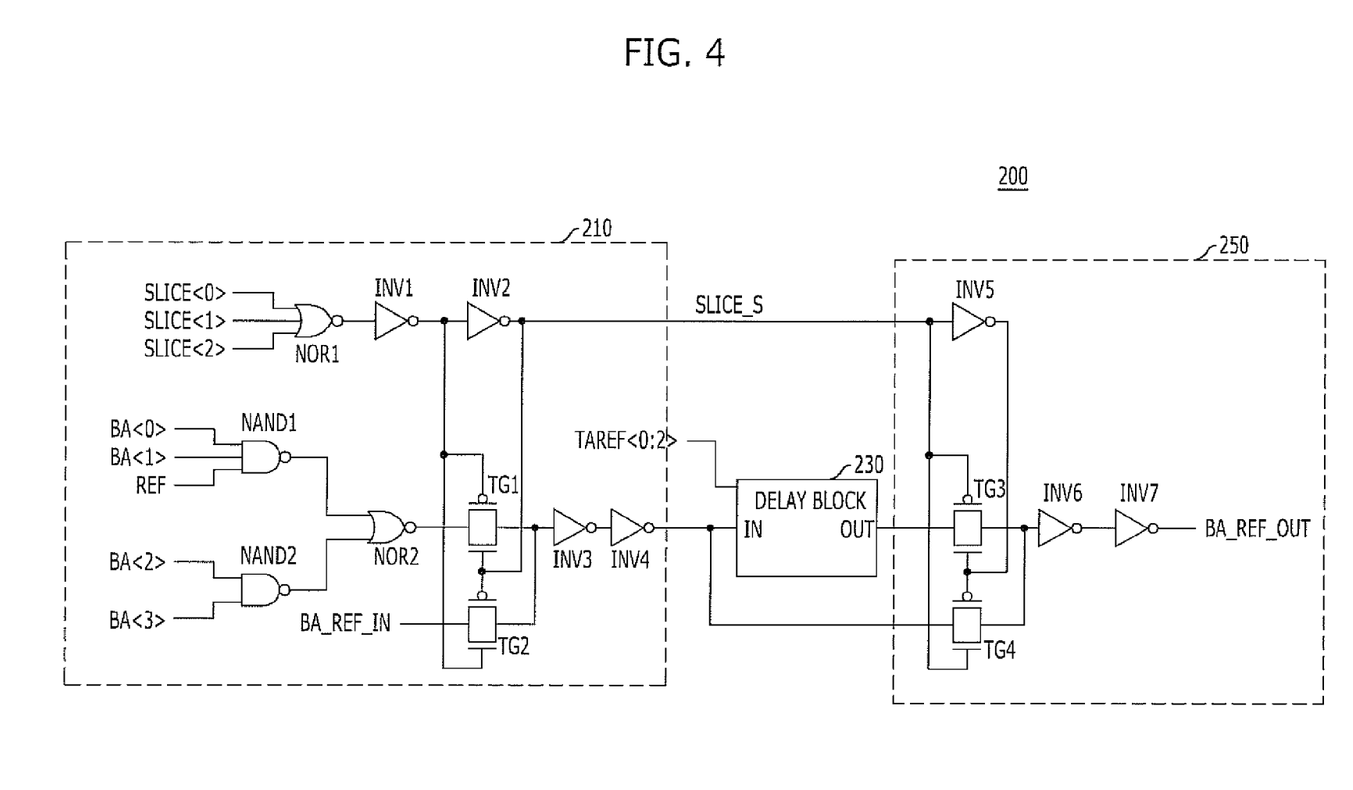
FIG. 4 is a circuit diagram illustrating a delay control circuit shown in FIG. 3 in accordance with an exemplary embodiment of the present invention.

FIG. 4 is a circuit diagram illustrating the delay control circuit 200 shown in FIG. 3 in accordance with an exemplary embodiment of the present invention.

Referring to FIG. 4, the delay control circuit 200 includes a slave selection block 210, a delay block 230, and an output block 250.

The slave selection block 210 is configured to provide the output block 250 with a slave selection signal SLICE_S corresponding to each slave chip by using the slave chip discrimination signals SLICE<0:2>. Also, the slave selection block 210 is configured to provide the delay block 230 and the output block 250 with either the first input signal BA_REF_IN or a result of a logical operation on the bank active signals BA<0:3> and refresh signal REF, according to the slave chip discrimination signals SLICE<0:2>.

The slave selection block 210 includes a first NOR gate NOR1, first to fourth inverters INV1 to INV4, a first NAND gate NAND1, a second NAND gate NAND2, a second NOR gate NOR2, a first transmission gate TG1, and a second transmission gate TG2.

The first NOR gate NOR1 is configured to perform a NOR operation on the slave chip discrimination signals SLICE<0:2>, and provide the operation result to the output block 250 via the first inverter INV1 and the second inverter INV2.

The first inverter INV1 is configured to invert an output signal of the first NOR gate NOR1. The inverted signal output from the first inverter INV1 is provided to the second inverter INV2, the first transmission gate TG1 and the second transmission gate TG2.

The second inverter INV2 is configured to invert the output signal of the first inverter INV1, and to provide the output block 250 with the inverted signal as the slave selection signal SLICE_S.

The first NAND gate NAND1 is configured to perform a NAND operation on the bank active signals BA<0:1> and the refresh signal REF, and provide the second NOR gate NOR2 with the operation result.

The second NAND gate NAND2 is configured to perform a NAND operation on the bank active signals BA<2:3>, and provide the second NOR gate NOR2 with the operation result.

The second NOR gate NOR2 is configured to perform a NOR operation on the output signals of the first NAND gate NAND1 and the second NAND gate NAND2, and provide the first transmission gate TG1 with the operation result.

The first transmission gate TG1 is configured to transmit the output signal of the second NOR gate NOR2 to the third inverter INV3 in response to the output signal of the first inverter INV1 and the output signal of the second inverter INV2.

The second transmission gate TG2 is configured to receive the output signal BA_REF_OUT of a lower slave chip as a first input signal BA_REF_IN, and transmit the first input signal BA_REF_IN to the input of the third inverter INV3 in response to the output signal of the first inverter INV1 and the output signal of the second inverter INV2.

The third inverter INV3 is configured to receive the output signal of the first transmission gate TG1 or the output signal of the second transmission gate TG2, and provide the fourth inverter INV4 with an inverted signal.

The fourth inverter INV4 is configured to invert the output signal of the third inverter INV3 and provide the delay block 230 and the output block 250 with the inverted signal.

The delay block 230 is configured to delay the output signal of the fourth inverter INV4 by a certain delay amount, and output the delayed signal. Meanwhile, in the case of the test mode, the delay block 230 may be configured to stop delaying the output signal of the fourth inverter INV4, and receive the test refresh signals TAREF<0:2> from the master chip 100, and delay the test refresh signals TAREF<0:2> by a certain delay amount to output the delayed signal.

The delay block 230 may be formed of inverter chains in which a plurality of inverters (not shown) are serially coupled to one another, or may be formed as a variable type.

The output block 250 is configured to selectively output the output signal of the delay block 230 or the output signal of the slave selection block 210 as the first output signal BA_REF_OUT of the slave chip in response to the slave selection signal SLICE_S received from the slave selection block 210.

The output block 250 includes a fifth inverter INV5, a sixth inverter INV6, a seventh inverter INV7, a third transmission gate TG3 and a fourth transmission gate TG4.

The fifth inverter is configured to receive and invert the output signal of the second inverter INV2. The third transmission gate TG3 is configured to transmit the output signal of the delay block 230 in response to the output signal of the second inverter INV2 and the output signal of the fifth inverter INV5.

The fourth transmission gate TG4 is configured to transmit the output signal of the fourth inverter INV4 in response to the output signal of the second inverter INV2 and the output signal of the fifth inverter INV5.

The sixth inverter INV6 is configured to receive and invert the output signal of the third transmission gate TG3 or the output signal of the fourth transmission gate TG4.

The seventh inverter INV7 is configured to invert the output signal of the sixth inverter INV6, and to output the inverted signal as the first output signal BA_REF_OUT. Further, the seventh inverter INV7 provides the first output signal BA_REF_OUT to the mode selection circuit 300 and the end signal generation circuit 400.

Referring again to FIG. 3, the mode selection circuit 300 is configured to receive the refresh signal REF and the bank active signals BA<0:3>, for example, from the master chip 100, and receive the first output signal BA_REF_OUT from the corresponding delay control circuit 200.

During a refresh mode, the mode selection circuit 300 is configured to output the first output signal BA_REF_OUT of the slave chip as mode selection output signals BA_OUT<0:3>. During a normal mode, the mode selection circuit 300 is configured to output the received bank active signals BA<0:3> as the mode selection output signals BA_OUT<0:3>.

Figure 5:
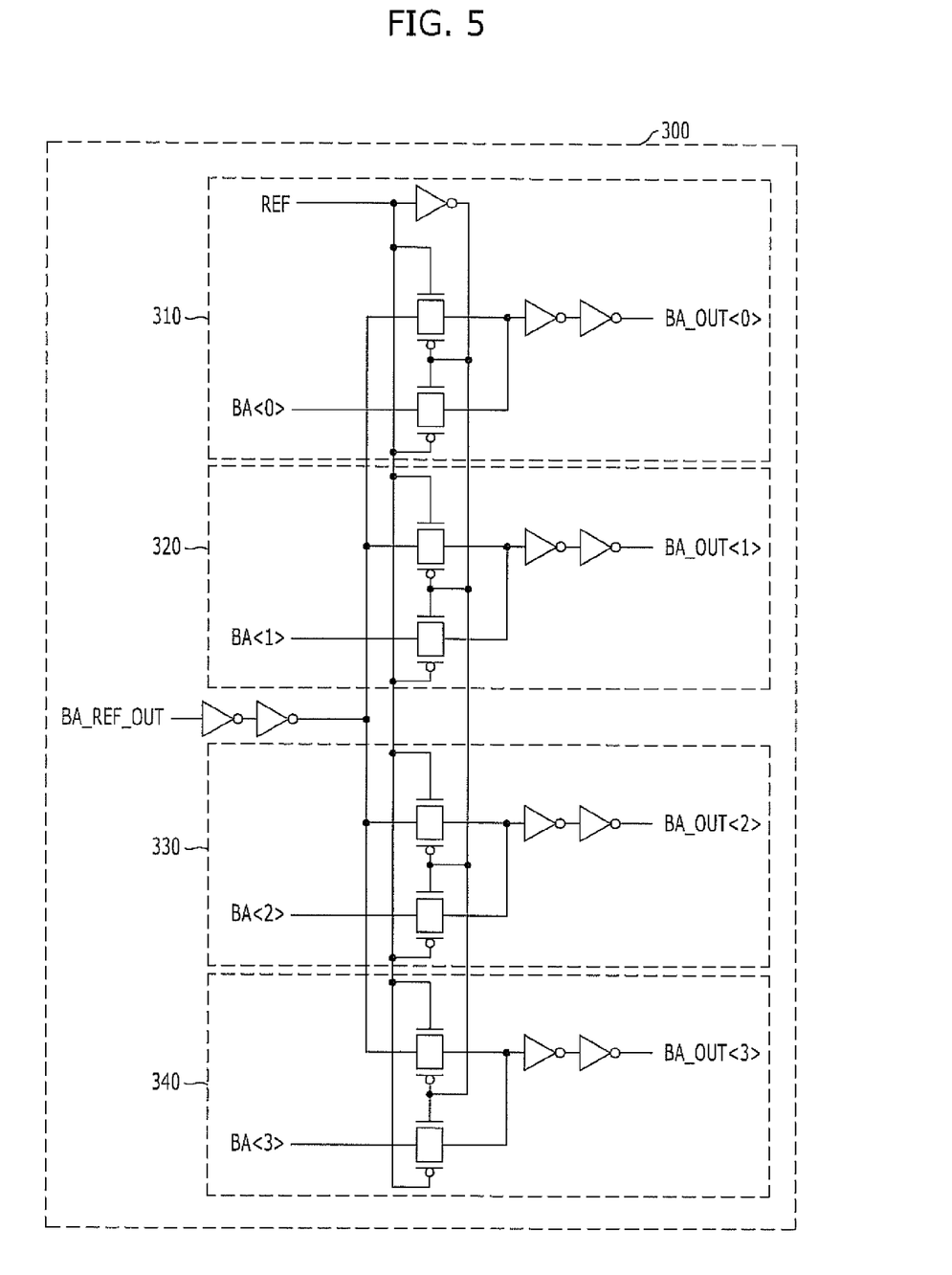
FIG. 5 is a circuit diagram illustrating a mode selection circuit shown in FIG. 3 in accordance with an exemplary embodiment of the present invention.

FIG. 5 is a circuit diagram illustrating the mode selection circuit shown in FIG. 3 in accordance with an exemplary embodiment of the present invention.

Referring to FIG. 5, the mode selection circuit 300 includes a first operation selection block 310, a second operation selection block 320, a third operation selection block 330, and a fourth operation selection block 340.

The first operation selection block 310 is configured to selectively output the first output signal BA_REF_OUT or the first bank active signal BA<0> as a mode selection output signal BA_OUT<0> in response to the refresh signal REF, which is received, for example, from the master chip 100, and the inverted refresh signal.

That is, during the refresh mode, the first output signal BA_REF_OUT is outputted as the mode selection output signal BA_OUT<0>. While during the normal mode, the first bank active signal BA<0> is outputted as the mode selection output signal BA_OUT<0>.

The second operation selection block 320 is configured to selectively output the first output signal BA_REF_OUT or the second bank active signal BA<1> as a mode selection output signal BA_OUT<1> in response to the refresh signal REF, which is received, for example, from the master chip 100, and the inverted refresh signal.

That is, during the refresh mode, the first output signal BA_REF_OUT is outputted as the mode selection output signal BA_OUT<1>. While during the normal mode, the second bank active signal BA<1> is outputted as the mode selection output signal BA_OUT<1>.

The third operation selection block 330 is configured to selectively output the first output signal BA_REF_OUT or the third bank active signal BA<2> as a mode selection output signal BA_OUT<2> in response to the refresh signal REF, which is received, for example, from the master chip 100, and the inverted refresh signal.

That is, during the refresh mode, the first output signal BA_REF_OUT is outputted as the mode selection output signal BA_OUT<2>. While during the normal mode, the third bank active signal BA<2> is outputted as the mode selection output signal BA_OUT<2>.

The fourth operation selection block 340 is configured to selectively output the first output signal BA_REF_OUT or the fourth bank active signal BA<3> as a mode selection output signal BA_OUT<3> in response to the refresh signal REF, which is received, for example, from the master chip 100, and the inverted refresh signal.

That is, during the refresh mode, the first output signal BA_REF_OUT is outputted as the mode selection output signal BA_OUT<3>. While, during the normal mode, the fourth bank active signal BA<3> is outputted as the mode selection output signal BA_OUT<3>.

Referring again to FIG. 3, the end signal generation circuit 400 is configured to receive a slave end signal SLICE_END having information representing the last (uppermost) slave chip from the master chip 100, receive the first output signal BA_REF_OUT of the slave chip, generate the bank active end signal BA_REF_END having information representing an end of bank activation, and provide the master chip 100 with the bank active end signal BA_REF_END through the third through silicon via L3.

The master chip 100 is configured to disable the refresh operation in the refresh period tRFC in response to the bank active end signal BA_REF_END.

Figure 6:
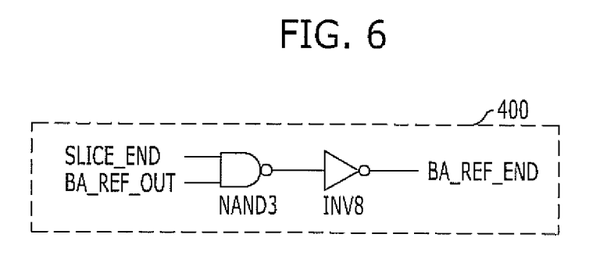
FIG. 6 is a circuit diagram illustrating an end signal generation circuit in accordance with an exemplary embodiment of the present invention.

FIG. 6 is a circuit diagram illustrating the end signal generation circuit 400 in accordance with an exemplary embodiment of the present invention.

Referring to FIG. 6, the end signal generation circuit 400 includes a third NAND gate NAND3 and an eighth inverter INV8.

The third NAND gate NAND3 is configured to perform a NAND operation on the slave end signal SLICE_END and the first output signal BA_REF_OUT.

The eighth inverter INV8 is configured to invert the output signal of the third NAND gate NAND3, and provide the inverted signal to the master chip 100 as the bank active end signal BA_REF_END.

Hereinafter, the operation of the semiconductor device for controlling the refresh operation of the plurality of stacked chips in accordance with an exemplary embodiment of the present invention will be described with reference to FIGS. 2 to 6.

The operation of the semiconductor device in the refresh mode will be described.

In the refresh mode, the master chip 100 is configured to provide the plurality of slave chips SLAVE0 to SLAVE7 with the refresh signal REF, the bank active signals BA<0:3>, and the slave chip discrimination signals SLICE<0:2> through the first through silicon via L1.

Referring to FIGS. 3 and 4, since the slave chip discrimination signals SLICE<0:2>, which are received by the first NOR gate NOR1 in the slave selection block 210 of the delay control circuit 200 of the first slave chip SLAVE0 from the master chip 100, have a value of '000', the output value of the first NOR gate NOR1 is a logic 'High', the output value of the first inverter INV1 is a logic 'Low', and the output value of the second inverter INV2 is a logic 'High'.

Thus, the first transmission gate TG1 transmits the output signal of the second NOR gate NOR2 in response to the output of the first inverter INV1, having the logic 'Low' value, and the output of the second inverter INV2, having the logic 'High' value.

The second transmission gate TG2 interrupts the first input signal BA_REF_IN in response to the output of the second inverter INV2, having the logic 'High' value, and the output of the first inverter INV1, having the logic 'Low' value.

That is, the output signal of the second NOR gate NOR2 is provided to the delay block 230 and the fourth transmission gate TG4 via the third inverter INV3 and the fourth inverter INV4.

The fifth inverter INV5 of the output block 250 is configured to invert the output of the second inverter INV2 having the logic 'High' value, and provide a logic 'Low' value to the third transmission gate TG3 and the fourth transmission gate TG4.

The third transmission gate TG3 interrupts the transmission of the output value of the delay block 230 in response to the output of the second inverter INV2, having the logic 'High' value, and the output of the fifth inverter INV5, having the logic 'Low' value.

The fourth transmission gate TG4 transmits the output signal of the fourth inverter INV4 as the first output signal BA_REF_OUT, having the logic 'High' value, via the sixth inverter INV6 and the seventh inverter INV7, in response to the output of the fifth inverter INV5, having the logic 'Low' value, and the output of the second inverter INV2, having the logic 'High' value.

That is, the output signal of the second NOR gate NOR2 is outputted as the first output signal BA_REF_OUT via the third inverter INV3, the fourth inverter INV4, the fourth transmission gate TG4, the sixth inverter INV6, and the seventh inverter INV7.

The first output signal BA_REF_OUT, which is outputted from the delay control circuit 200, is provided to the mode selection circuit 300 and the end signal generation circuit 400.

Referring to FIGS. 3 and 5, the first operation selection block 310 of the mode selection circuit 300 is configured to transmit the first output signal BA_REF_OUT in response to the refresh signal REF in the logic 'High' state, which is received from the master chip 100, and the inverted refresh signal (at the logic 'Low' level), and interrupt the bank active signals BA<0:3>.

That is, during the refresh mode, the first output signal BA_REF_OUT of a first slave chip is outputted as the mode selection output signal BA_OUT<0>, and is provided as the first input signal BA_REF_IN of a second slave chip SLAVE1.

Referring to FIGS. 3 and 6, the third NAND gate NAND3 of the end signal generation circuit 400 is configured to perform a NAND operation on the first output signal BA_REF_OUT, having the logic 'High' value, and the slave end signal SLICE_END, having the logic 'Low' value (because it is not the uppermost slave chip), and output a logic 'High' value.

The eighth inverter INV8 of the end signal generation circuit 400 receives the logic 'High' value, and outputs a logic 'Low' value as the bank active end signal BA_REF_END.

Thus, the master chip 100 recognizes that the activation of the banks has not been ended.

Referring again to FIGS. 3 and 4, in the second slave chip SLAVE1, since the slave chip discrimination signals SLICE<0:2>, which are received by the first NOR gate NOR1 from the master chip 100, have a value of '001', the output value of the first NOR gate NOR1 is a logic 'Low', the output value of the first inverter INV1 is a logic 'High', and the output value of the second inverter INV2 is a logic 'Low'.

Thus, the first transmission gate TG1 interrupts the output signal of the second NOR gate NOR2 in response to the output of the first inverter INV1, having the logic 'High' value, and the output of the second inverter INV2, having the logic 'Low' value.

The second transmission gate TG2 transmits the first input signal BA_REF_IN to the third inverter INV3 in response to the output of the second inverter INV2, having the logic low' value, and the output of the first inverter INV1, having the logic 'High' value.

That is, the first input signal BA_REF_IN, which is provided from the first slave chip SLAVE0, is provided to the delay block 230 and the fourth transmission gate TG4 via the third inverter INV3 and the fourth inverter INV4 of the second slave chip SLAVE1.

The fifth inverter INV5 of the output block 250 inverts the output of the second inverter INV2 having the logic 'Low' value, and provides the output signal of the fifth inverter INV5 having a logic 'High' value to the third transmission gate TG3 and the fourth transmission gate TG4.

The third transmission gate TG3 transmits the output value of the delay block 230 in response to the output of the second inverter INV2, having the logic 'Low' value, and the output of the fifth inverter INV5, having the logic 'High' value.

The fourth transmission gate TG4 interrupts the output signal of the fourth inverter INV4 in response to the output of the fifth inverter INV5, having the logic 'High' value, and the output of the second inverter INV2, having the logic 'Low' value.

That is, the first input signal BA_REF_IN provided from the first slave SLAVE0 is delayed in the delay block 230 by a certain delay amount, and the delayed slave input signal is outputted as the first output signal BA_REF_OUT via the third transmission gate TG3, the sixth inverter INV6, and the seventh inverter INV7.

The first output signal BA_REF_OUT, which is outputted from the delay control circuit 200, is provided to the corresponding mode selection circuit 300 and the corresponding end signal generation circuit 400.

Referring to FIGS. 3 and 5, the second operation selection block 320 of the mode selection circuit 300 is configured to transmit the first output signal BA_REF_OUT in response to the refresh signal REF in the logic 'High' state, which is received from the master chip 100, and the inverted refresh signal (at the logic 'Low' level), and interrupt the bank active signals BA<0:3>.

That is, during the refresh mode, the first output signal BA_REF_OUT of the second slave chip is outputted as the mode selection output signal BA_OUT<1>, and is provided as the first input signal BA_REF_IN of a third slave chip SLAVE2.

Referring to FIGS. 3 and 5, since the second operation selection block 320 of the mode selection circuit 300 of the second slave chip SLAVE1 performs an operation equivalent to that of the first operation selection block 310 of the mode selection circuit 300 of the first slave chip SLAVE0, a description thereof will be omitted.

Furthermore, since the end signal generation circuit 400 of the second slave chip SLAVE1 performs an operation equivalent to that of the end signal generation circuit 400 of the first slave chip SLAVE0, a description thereof will also be omitted.

Since the operations of the third slave chip SLAVE2 to the eighth slave chip SLAVE7 are equivalent to that of the second slave chip SLAVE1 except for the operation of the end signal generation circuit 400, descriptions thereof will also be omitted.

The third NAND gate NAND3 of the end signal generation circuit 400 of the eighth slave chip SLAVE8 is configured to perform a NAND operation on the first output signal BA_REF_OUT of the slave chip, having a logic 'High' value, and the slave end signal SLICE_END, having a logic 'High' value (because it is the uppermost slave chip), and output a logic 'Low' value.

The eighth inverter INV8 of the end signal generation circuit 400 is configured to receive and invert the logic 'Low' value, and provide the master chip 100 with a logic 'High' value as the bank active end signal BA_REF_END.

Thus, the master chip 100 recognizes that the activation of the banks has been ended and disables the refresh signal REF.

Referring to FIGS. 3 and 5, in the normal mode (i.e., not in the refresh mode), the bank active signals BA<0:3> received from the master chip 100 are outputted as is, so that the normal operation is performed.

Figure 7:
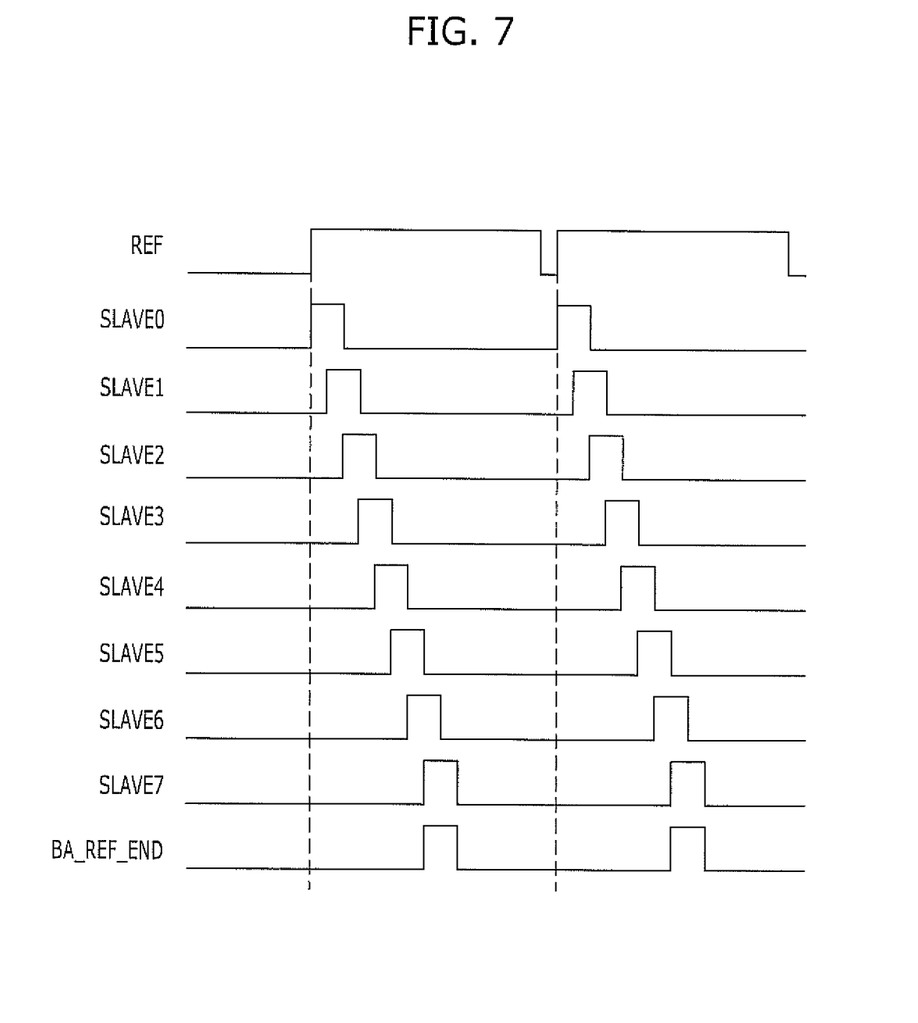
FIG. 7 is a timing chart illustrating refresh timings in slave chips for controlling a refresh operation of a plurality of stacked chips in accordance with an exemplary embodiment of the present invention.

FIG. 7 is a timing chart illustrating refresh timings in slave chips for controlling the refresh operation of the plurality of stacked chips in accordance with an exemplary embodiment of the present invention.

Referring to FIG. 7, as described above, it can be understood that a refresh timing in each slave chip is delayed by a certain delay amount.

As described above, in a system, a semiconductor device, and a method for controlling a refresh operation of a plurality of stacked chips in accordance with an exemplary embodiment of the present invention, each slave chip is delayed by a certain delay amount for activation and a refresh operation of each slave chip may be performed at different timings, resulting in the reduction of a peak current.

Furthermore, consumption of a current may be distributed by performing the refresh operation of each slave chip at different timings, in order to compensate for a limited capacity of a power supply driving unit. Consequently, an area occupied by the power supply driving unit may be reduced, resulting in the improvement of productivity.

While the present invention has been described with respect to the specific embodiments, it will be apparent to those skilled in the art that various changes and modifications may be made without departing from the spirit and scope of the invention as defined in the following claims.

What is claimed is:

1. A semiconductor system for controlling a refresh operation of a plurality of stacked semiconductor chips, comprising:
   a first semiconductor chip configured to output a refresh signal for performing a refresh operation and a semiconductor chip discrimination signal; and
   a plurality of second semiconductor chips configured to perform a refresh operation at different timings in response to the refresh signal and the semiconductor chip discrimination signal,
   wherein each of the plurality of second semiconductor chips is configured to delay an activation of banks in the refresh operation in response to a first delayed input signal which serves as a bank active signal in the refresh operation.

2. The system of claim 1, wherein the first input signals of the plurality of second semiconductor chips are sequentially delayed.

3. The system of claim 1, wherein the plurality of second semiconductor chips are configured to output the first delayed input signal to another second semiconductor chip.

4. The system of claim 3, wherein the refresh signal, the first input signal, and the semiconductor chip discrimination signal are provided to the plurality of second semiconductor chips through TSVs.

5. The system of claim 1, wherein the first semiconductor is configured to provide the plurality of second semiconductor chips with a test refresh signal which serves as a refresh signal in a test mode.

6. The system of claim 1, wherein one of the plurality of second semiconductor chips is configured to generate a bank end signal representing operation completion of banks, and provide the bank end signal to the first semiconductor.

7. The system of claim 1, wherein each of the plurality of second semiconductor chips comprises:
   a delay control circuit configured to delay a first input signal which serves as a bank active signal in a refresh operation, in response to the semiconductor chip discrimination signal, and output the first delayed input signal as a first output signal of the corresponding second semiconductor; and
   an end signal generation circuit configured to generate a bank active end signal representing an end of bank activation, in response to a slave end signal for a last second semiconductor, and the first output signal of the last second semiconductor.

8. The system of claim 7, wherein the first semiconductor is configured to receive the bank active end signal, and end the refresh operation in response to the bank active end signal.

9. The system of claim 7, further comprising a mode selection circuit configured to receive the refresh signal, the bank active signal from the first semiconductor, and the first output signal of the delay control circuit, and output the first output signal as a mode selection output signal during a refresh mode, and output the bank active signal as the mode selection output signal during a normal mode.

10. The system of claim 7, wherein the delay control circuit comprises:
   a slave selection block configured to output a slave selection signal which corresponds to each second semiconductor, and output a bank active signal or the first input signal, in response to the refresh signal, a bank active signal, the semiconductor chip discrimination signal, and the first input signal;
   a delay block configured to delay the first input signal by a certain delay amount; and
   an output block configured to selectively output an output signal of the delay block or an output signal of the slave selection block in response to the slave selection signal.

11. The system of claim 10, wherein the delay block is configured to receive a test mode refresh signal from the first semiconductor in a test mode, and delay the test mode refresh signal.

12. The system of claim 7, wherein the end signal generation circuit comprises a NAND gate configured to perform a NAND operation on the slave end signal and the first output signal of the second semiconductor.

13. A semiconductor device for controlling a refresh operation, comprising:
   a delay control circuit configured to delay a first input signal which serves as a bank active signal in a refresh operation, in response to a semiconductor chip discrimination signal, and output the delayed signal as a first output signal of a semiconductor chip; and
   an end signal generation circuit configured to generate a bank active end signal representing end of bank activation, in response to a slave end signal representing a last semiconductor chip, and the first output signal of the last second semiconductor.

* * * * *